United States Patent
Lee (10) Patent No.: US 7,034,565 B2
(45) Date of Patent: Apr. 25, 2006

(54) ON-DIE TERMINATION CIRCUIT AND METHOD FOR REDUCING ON-CHIP DC CURRENT, AND MEMORY SYSTEM INCLUDING MEMORY DEVICE HAVING THE SAME

(75) Inventor: Jung-bae Lee, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 135 days.

(21) Appl. No.: 10/716,120

(22) Filed: Nov. 18, 2003

(65) Prior Publication Data

US 2004/0100837 A1    May 27, 2004

(30) Foreign Application Priority Data

Nov. 20, 2002    (KR) .................... 10-2002-0072478

(51) Int. Cl.
*H03K 19/003*    (2006.01)

(52) U.S. Cl. ........................................ 326/30; 326/26
(58) Field of Classification Search ................ 326/30, 326/21, 26, 31
See application file for complete search history.

(56) References Cited

U.S. PATENT DOCUMENTS 5,831,467 A * 11/1998 Leung et al. ............... 327/319
6,356,106 B1 * 3/2002 Greeff et al. ................. 326/30

* cited by examiner

*Primary Examiner*—James H. Cho
(74) *Attorney, Agent, or Firm*—F.chau & Associates,LLC (57) ABSTRACT

Provided are an on-die termination ("ODT") circuit and ODT method which are capable of minimizing consumption of an on-chip DC current, and a memory system which adopts a memory device having the same, where the ODT circuit includes a termination voltage port, a data input/output ("I/O") port, a first termination resistor, a switch, and a termination enable signal generating circuit; the termination voltage port receives termination voltage from a voltage regulator or a memory controller which is installed outside the memory device; one end of the first termination resistor is connected to the data I/O port; the switch selectively connects the termination voltage port to the other end of the first termination resistor in response to a termination enable signal; the termination enable signal generating circuit generates the termination enable signal in response to a signal which indicates a valid section of input data or that the present period is not a read period during write operations of the memory device, and may also generate the termination enable signal in response to a signal output from a mode register set ("MRS"); and the ODT circuit may include a second termination resistor, one end of which is connected to the data I/O port and the other end of which is connected to the termination voltage port.

20 Claims, 5 Drawing Sheets

ON-DIE TERMINATION CIRCUIT AND METHOD FOR REDUCING ON-CHIP DC CURRENT, AND MEMORY SYSTEM INCLUDING MEMORY DEVICE HAVING THE SAME

CROSS-REFERENCE TO RELATED APPLICATION

This application claims foreign priority under 35 U.S.C. § 119 to Korean Patent Application No. 2002-72478, filed Nov. 20, 2002, in the Korean Intellectual Property Office.

BACKGROUND OF THE INVENTION

1. Field of the Invention

The present invention relates to a memory device, and more particularly, to an on-die termination (hereinafter referred to as 'ODT') circuit and method for a memory device.

2. Description of the Related Art

Figure 1:
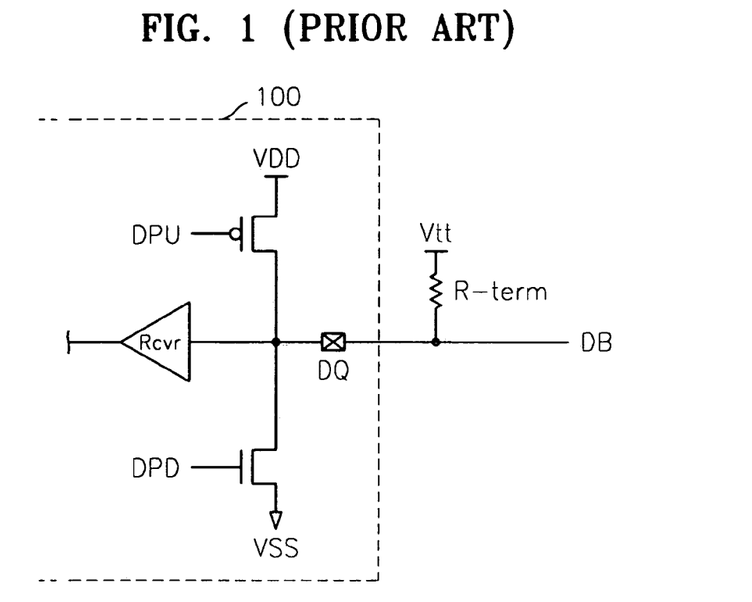
FIG. 1 is a circuit diagram illustrating a conventional external ODT system.

An increase in the operating speed of a synchronous memory device results in a need for the termination of a transmission line, which is connected to a data input/output pin of a synchronous memory device in a memory system. An interface of a double data rate synchronous DRAM ("DDR SDRAM") is based on stub series terminated transceiver logic ("SSTL") using a termination resistor R-term outside of a memory device, such as a memory device 100 as shown in FIG. 1. In addition to the termination resistor R-term, a voltage regulator is required to generate termination voltage Vtt, thereby increasing the costs for an increased speed memory system.

Figure 2:
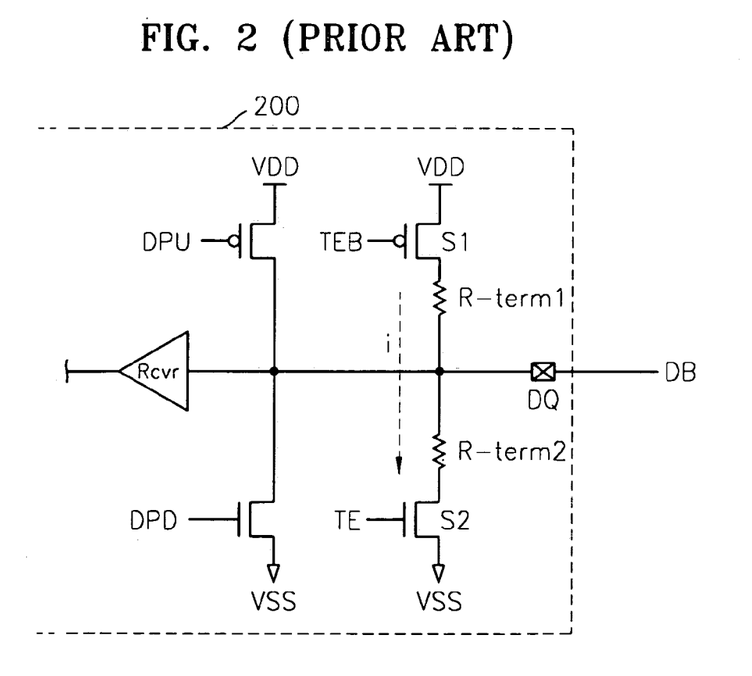
FIG. 2 is a circuit diagram illustrating a conventional rail-to-rail ODT system.

A rail-to-rail ODT system, as shown in FIG. 2, has been suggested to solve this problem by eliminating the requirement for a voltage regulator. The ODT system includes a memory device 200 including termination resistors R-term1 and R-term2, and controls connection of the termination resistors R-term1 and R-term2 using switch transistors S1 and S2. In detail, when a termination enable signal TE is activated to logic 'high', the switch transistors S1 and S2 are turned on to enable the ODT system. However, the ODT system is disadvantageous in that during the enabling of the ODT system, the path of an electric current is formed between a supply voltage VDD and ground voltage VSS, thereby increasing consumption of an on-chip DC current.

In the case of DRAM including more than about sixteen pins, if an ODT circuit is installed in each pin, the amount of electric current is very large when all of the ODT circuits are simultaneously enabled. In this case, the amount of electric current is almost equivalent to that of the electric current for operating DRAM. Therefore, the total power consumption of DRAM substantially increases.

SUMMARY OF THE INVENTION

The present invention provides an on-die termination ("ODT") circuit and method that are capable of minimizing consumption of on-chip DC current, as well as a memory system adopting a synchronous memory device having such an ODT circuit.

According to an aspect of the present invention, there is provided an ODT circuit for use in a synchronous memory device, the ODT circuit comprising a termination voltage port for receiving a termination voltage; a data input/output ("I/O") port; a first termination resistor, one end of which is connected to the data I/O port; and a switch which selectively connects the other end of the first termination resistor to the termination voltage port in response to a termination enable signal.

The ODT circuit may further include a termination enable signal generating circuit for generating the termination enable signal in response to a signal which indicates a valid section of input data or indicates that the present period is not a read period during write operations of the synchronous memory device, and for generating the termination enable signal in response to a signal output from a mode set register ("MRS").

The termination enable signal is enabled when the signal output from the MRS is disabled and the signal which indicates a valid section of the input data or indicates that the present period is not a read period is enabled. Also, the termination enable signal is enabled when the signal output from the MRS is enabled, irrespective of the signal indicating an effective section of the input data or indicating that the present period is not a read period.

The ODT circuit further includes a second termination resistor, one end of which is connected to the data I/O port and the other end of which is connected to the termination voltage port.

According to another aspect of the present invention, there is provided an ODT method for a synchronous memory device, comprising installing a termination voltage port in the synchronous memory device, the termination voltage port receiving a termination voltage; installing a first termination resistor in the synchronous memory device, the first termination resistor having one end connected to a data I/O port in the synchronous memory device; and selectively connecting the other end of the first termination resistor to the termination voltage port.

Selectively connecting the other end of the first termination resistor is performed in a valid section of input data during write operations of the synchronous memory device. Also, selectively connecting the other end of the first termination resistor is performed in periods other than read operations of the synchronous memory device. Also, selectively connecting the other end of the first termination resistor is performed when an MRS included in the synchronous memory device is set outside the synchronous memory device.

The ODT method further includes installing a second termination resistor in the synchronous memory device, the second termination resistor having one end connected to the data I/O port and the other end connected to the termination voltage port.

According to yet another aspect of the present invention, there is provided a memory system comprising: a memory controller; a voltage regulator which generates a termination voltage; and a synchronous memory device which is connected to the memory controller and the voltage regulator and includes an ODT circuit, wherein the ODT circuit comprises: a termination voltage port which receives the termination voltage from the voltage regulator; a data I/O port which receives input data from the memory controller or outputs output data to the memory controller; a first termination resistor, one end of which is connected to the data I/O port; and a switch which selectively connects the other end of the first termination resistor to the termination voltage port in response to a termination enable signal.

According to still another aspect of the present invention, there is provided a memory system comprising: a memory controller which generates a termination voltage; and a synchronous memory device which is connected to the memory controller and includes an ODT circuit, wherein the ODT circuit comprises: a termination voltage port which receives the termination voltage from the memory controller; a data I/O port which receives input data from the memory controller or outputs output data to the memory controller; a first termination resistor, one end of which is connected to the data I/O port; and a switch which selectively connects the other end of the first termination resistor to the termination voltage port in response to a termination enable signal.

According to still another aspect of the present invention, there is provided a memory system comprising: a memory controller; and a plurality of synchronous memory devices which are connected to the memory controller via a channel and include an ODT circuit, wherein the ODT circuit is enabled in only at least one of the plurality of the memory devices which is furthest from the memory controller and is disabled in the other memory devices.

The ODT circuit comprises a termination voltage port which receives termination voltage; a data I/O port; a first termination resistor, one end of which is connected to the data I/O port; and a switch which connects the termination voltage port to the other end of the first termination resistor in response to an activated termination enable signal, wherein the termination enable signal is activated when an MRS installed in the memory device is set and the ODT circuit is enabled.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF PREFERRED EMBODIMENTS

Figure 3:
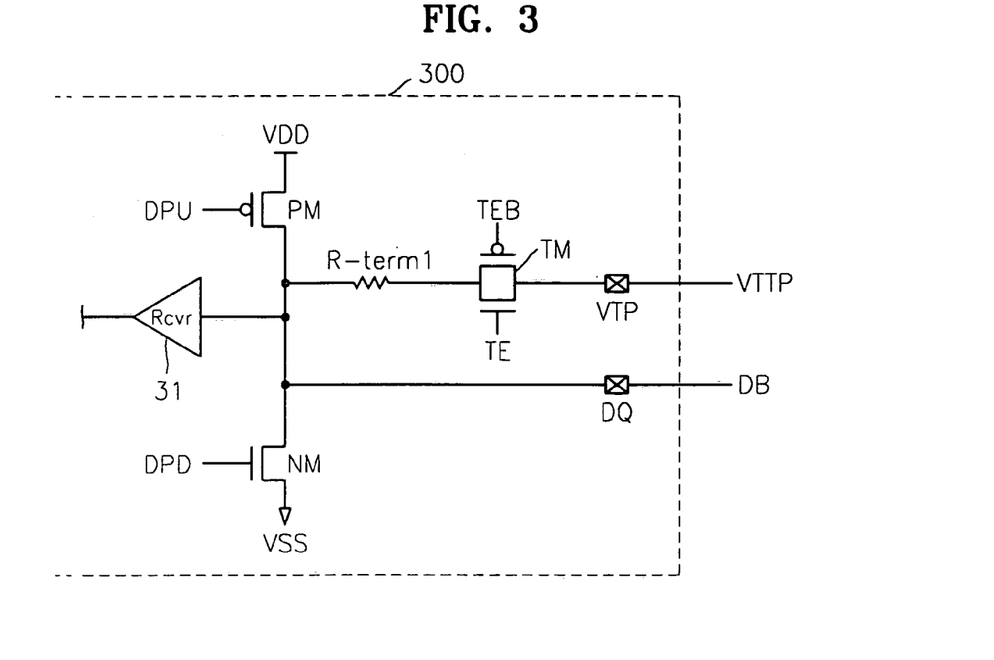
FIG. 3 is a circuit diagram illustrating an ODT system according to a first embodiment of the present invention.

FIG. 3 is a circuit diagram of an ODT system according to a first embodiment of the present invention. Referring to FIG. 3, the ODT system includes a synchronous memory device 300 in which a termination voltage port VTP, a termination resistor R-term1, and a switch TM are installed.

One end of the termination resistor R-term1 is connected to a data input/output ("I/O") port DQ, and the switch TM is connected between the other end of the termination resistor R-term1 and the termination voltage port VTP. The switch TM is made of a transmission gate and selectively connects the other end of the termination resistor R-term1 to the termination voltage port VTP in response to a termination enable signal TE. In FIG. 3, PM and NM denote a pull-up transistor of an output buffer and a pull-down transistor of the output buffer, respectively, and reference numeral 31 denotes an input buffer.

More specifically, termination voltage VTTP, which is input via the termination voltage port VTP, is applied to the termination resistor R-term1 or the application of the termination voltage VTTP is discontinued, using the switch TM. In this way, it is possible to selectively control the termination of a transmission line DB, i.e., a data bus, which is connected to the data I/O port DQ. A termination resistance value is the sum of a channel resistance value of the switch TM and a resistance value of the termination resistance R-term1. However, the channel resistance value of the switch TM may be so small that it can be considered negligible.

It is preferable that the number of termination voltage ports VTP is at least one. That is, the termination voltage VTTP input via the termination voltage port VTP must act as a sync and source of an electric current, and therefore, the more the termination voltage ports VTP, the better. In general, a DRAM has a configuration of ×4, ×8, ×16, or so on. Therefore, if the number of the data I/O ports DQ increases, the number of termination voltage ports VTP must also increase in order to obtain sufficient signal integrity. In this case, one termination voltage port VTP may be installed for each data I/O port DQ or one termination voltage port VTP may be installed for several data I/O ports DQ.

The termination enable signal TE may be generated using an internal signal that is enabled only in a period when input data is input during write operations of a synchronous memory device. Otherwise, the termination enable signal TE may be generated using an internal signal that is continuously enabled except during read operations of the synchronous memory device. If necessary, the termination enable signal TE may be generated using a mode register set ("MRS") included in a synchronous memory device.

Figure 4:
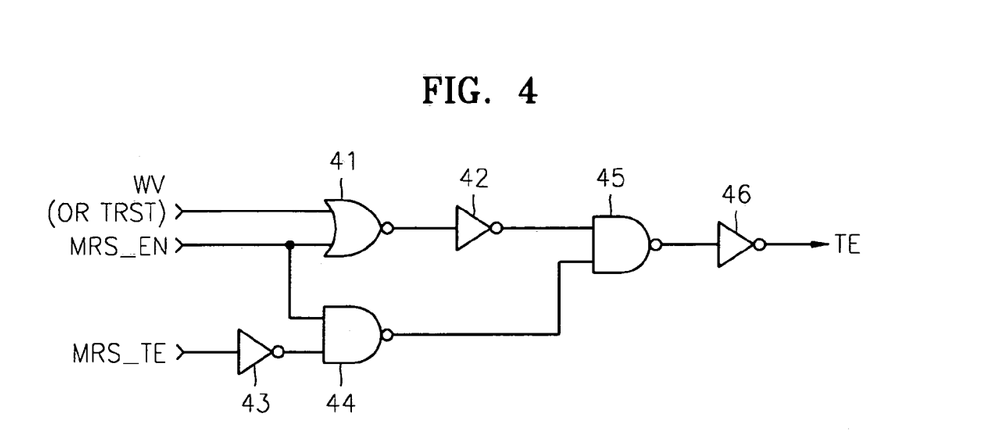
FIG. 4 is a circuit diagram of a termination enable signal generating circuit according to a first embodiment of the present invention.

FIG. 4 is a circuit diagram of a termination enable signal generating circuit (hereinafter, 'the first circuit') according to a first embodiment of the present invention. Referring to FIG. 4, the first circuit includes an NOR gate 41, a first inverter 42, a second inverter 43, a first NAND gate 44, a second NAND gate 45, and a third inverter 46.

The NOR gate 41 receives a signal WV or a signal TRST and receives an MRS enable signal MRS-EN. During write operations of a synchronous memory device, the signal WV indicates an effective section of input data and the signal TRST indicates that the current period is not a read period. The first inverter 42 inverts a signal output from the NOR gate 41, and the second inverter 43 inverts a signal MRS_TE.

The first NAND gate 44 receives the MRS enable signal MRS-EN and a signal output from the second inverter 43, and the second NAND gate 45 receives a signal output from the first inverter 42 and a signal output from the first NAND gate 44. The third inverter 46 inverts a signal output from the second NAND gate 45 to finally generate a termination enable signal TE.

The signal WV is generated in the synchronous memory device and enabled to logic 'high' only when input data is input during write operations of the synchronous memory device. The signal TRST is also generated in the synchronous memory device but is continuously enabled to logic 'high' except during read operations of the synchronous memory device. In general, the signal TRST is used as an enable signal for enabling an output driver of a synchronous memory device.

The MRS enable signal MRS_EN is a signal output from an MRS installed in the synchronous memory device and is enabled to logic 'high' when the MRS is set from the outside of the synchronous memory device. The signal MRS_TE is a signal for the termination of the transmission line DB during the enabling of the MRS enable signal MRS_EN.

More specifically, the termination enable signal TE is at logic 'high' when the signal WV, which indicates an effective section of input data, or the signal TRST, which indicates that the current period is not a read period, is at logic 'high' while the MRS enable signal MRS_EN is disabled to logic 'low'. Then, the switch TM shown in FIG. 3 is turned on to connect the termination voltage port VTP to the termination resistor R-term1, thereby causing the termination of the transmission line DB connected to the data I/O port DQ.

If the signal MRS_TE is at logic 'high' when the MRS enable signal MRS_EN is enabled to logic 'high', the termination enable signal TE is at logic 'high'. In other words, when both the MRS enable signal MRS_EN and the signal MRS_TE are at logics 'high', the termination enable signal TE is enabled to logic 'high' regardless of the level of the signal WV or the signal TRST, thereby causing the termination of the transmission line DB.

Figure 5:
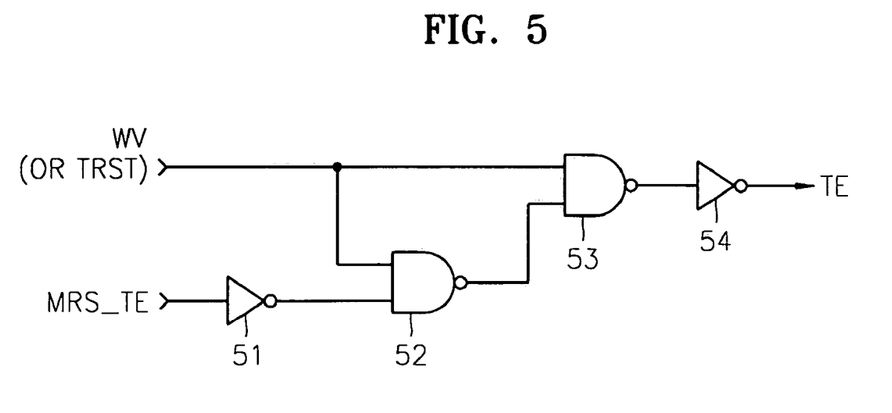
FIG. 5 is a circuit diagram of a termination enable signal generating circuit according to a second embodiment of the present invention.

FIG. 5 is a circuit diagram of a termination enable signal generating circuit (hereinafter, 'the second circuit') according to a second embodiment of the present invention. Referring to FIG. 5, the second circuit includes a first inverter 51, a first NAND gate 52, a second NAND gate 53, and a second inverter 54.

The first inverter 51 inverts a signal MRS_TE. The first NAND gate 52 receives a signal WV or a signal TRST and receives a signal output from the first inverter 51. During write operations of a synchronous memory device, the signal WV indicates an effective section of input data and the signal TRST indicates that the current period is not a read period. The second NAND gate 53 receives the signal WV or the signal TRST and receives a signal output from the first NAND gate 52.

More specifically, if the signal WV or the signal TRST is at logic 'low', a termination enable signal TE is disenabled to logic 'low' regardless of the level of the signal MRS_TE. If the signal WV or the signal TRST is at logic 'high', the termination enable signal TE is enabled to logic 'high' when the signal MRS_TE is at logic 'high' but is disenabled to logic 'low' when the signal MRS_TE is at logic 'low'.

Figure 6:
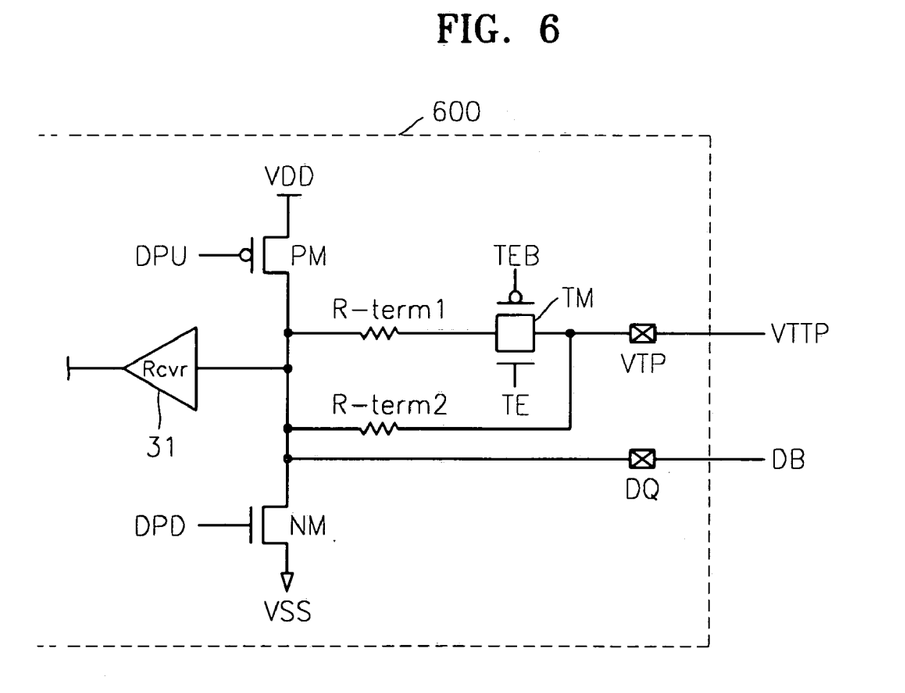
FIG. 6 is a circuit diagram of an ODT system according to a second embodiment of the present invention.

FIG. 6 is a circuit diagram of an ODT system according to a second embodiment of the present invention. Referring to FIG. 6, as compared to the ODT system according to the first embodiment, the ODT system further includes a second termination resistor R-term2 in a memory device 600.

One end of the second termination resistor R-term2 is connected to a data I/O port DQ, and the other end thereof is connected to a termination voltage port VTP. Here, a resistance value of the second termination resistor R-term2 is considerably larger than that of a first resistor R-term1.

In detail, if the termination of a transmission line DB is enabled only during write operations of the memory device 60, the transmission line DB is floated in periods, except for a read period, other than a write period, i.e., in periods other than read and write periods. However, during new write operations, it takes a predetermined time to place the transmission line DB at a termination level, thus weighing down a system.

To solve this problem, the ODT system according to the first embodiment provides that the termination of the transmission line DB be enabled in periods other than a read period. However, in this case, if a memory controller and a memory device perform write and read operations without a break, the transmission line DB may possibly be floated and as a result, the transmission line DB may possibly have an undesired voltage level at an instant of time.

Thus, to prevent the possible floating of the transmission line DB, the ODT system according to the second embodiment of the present invention further includes the second termination resistor R-term2 that continuously connects the data I/O port DQ to the termination voltage port VTP. As mentioned above, the second termination resistor R-term2 is used only to prevent the floating of the transmission line DB and thus has a still larger resistance value than the first termination resistor R-term1.

In the ODT system according to the second embodiment, when the switch TM is turned on to enable the termination of the transmission line DB, a termination resistance value becomes a parallel resistance value between the first termination resistor R-term1 and the second termination resistor R-term2. The parallel resistance value may approximate the resistance value of the first termination resistor R-term1 because the second termination resistor R-term2 is remarkably greater than the first termination resistor R-term1.

Figure 7:
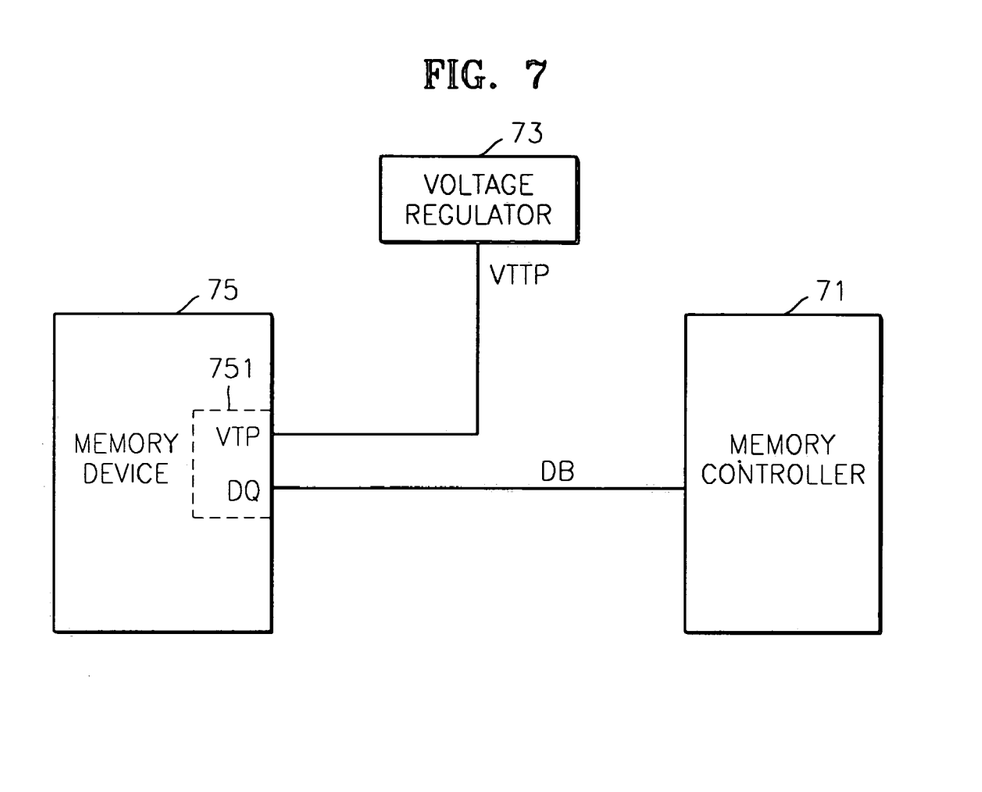
FIG. 7 is a block diagram of an example of a memory system that adopts a synchronous memory device including an ODT circuit according to the present invention.

FIG. 7 is a block diagram of an example of a memory system that adopts a synchronous memory device 75 including an ODT circuit 751 according to the present invention. In the memory system of FIG. 7, a voltage regulator 73 generates a termination voltage VTTP. The synchronous memory device 75, which includes the ODT circuit 751 as shown in FIG. 3 or FIG. 6, receives termination voltage VTTP, which is generated by the voltage regulator 73, via a termination voltage port VTP.

Figure 8:
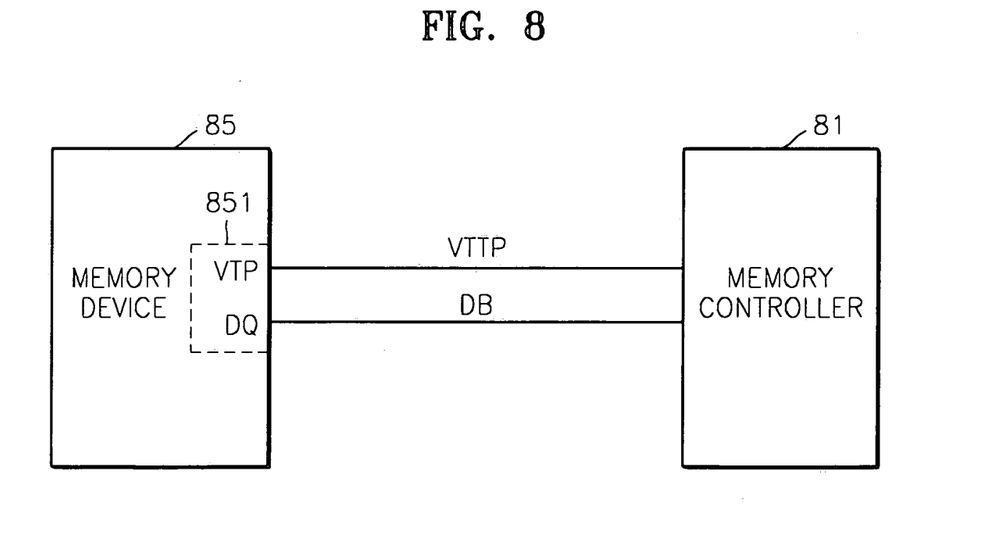
FIG. 8 is a block diagram of another example of a memory system that adopts a synchronous memory device including an ODT circuit according to the present invention.

FIG. 8 is a block diagram of another example of a memory system that adopts a synchronous memory device 85 including an ODT circuit 851 according to the present invention. In the memory system of FIG. 8, a memory controller 81 generates termination voltage VTTP. The synchronous memory device 85, which includes the ODT circuit 851, receives the termination voltage VTTP, which is generated by the memory controller 81, via a termination voltage port VTP.

Figure 9:
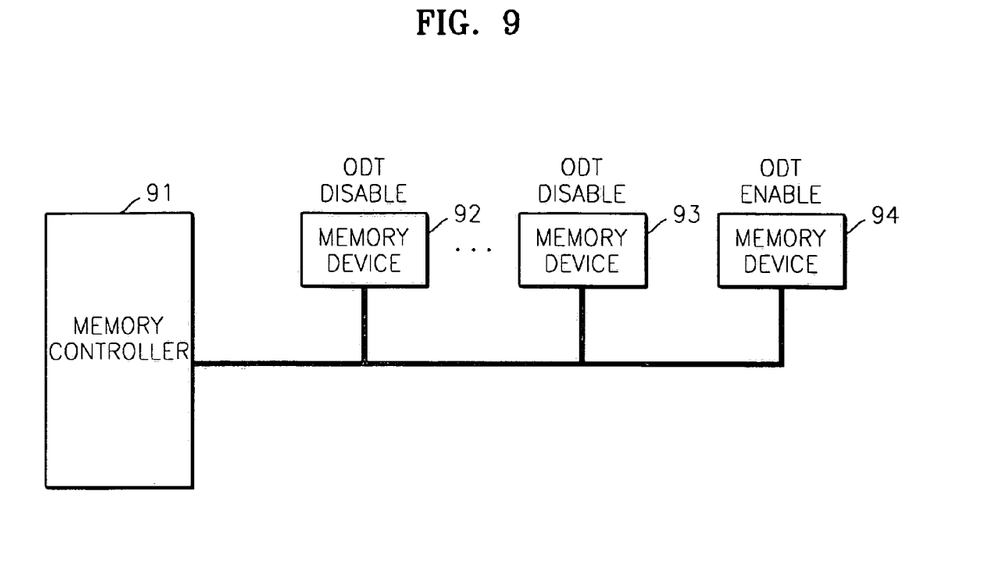
FIG. 9 is a block diagram of a memory system that adopts a multi-drop net shared by a plurality of synchronous memory devices, each of the synchronous memory devices including an ODT circuit according to the present invention.

FIG. 9 is a block diagram of a memory system that adopts a multi-drop net shared by a plurality of synchronous memory devices 91, . . . , 93, and 94, each of the synchronous memory devices including an ODT circuit according to the present invention. It is preferable that in a memory system adopting a multi-drop net as shown in FIG. 9, ODT is enabled in only the memory device 94 furthest from a memory controller 91, and is disabled in the other memory devices 91, . . . , and 93. Accordingly, only an MRS in the memory device 94 farthest from the memory controller 91 is set, without setting MRSs in the other memory devices 92, . . . , and 93.

In other words, in the memory device 94 having the set MRS, both signals MRS_EN and MRS_TE are at logic 'high', and thus a termination enable signal TE is enabled to logic 'high' in the termination enable signal generating circuit of FIG. 4, thereby enabling the ODT. However, in each of the memory devices 92, . . . , and 93 in which the MRS is not set, signals MRS_EN and MRS_TE are at logic 'low', and thus a termination enable signal TE is disenabled to logic 'low', thereby enabling the ODT.

In this disclosure, the memory system of FIG. 9 is constructed such that ODT of only the memory device 94 is enabled. However, if necessary, it is possible to make a memory system in which ODT of at least one memory device farthest from the memory controller 91 is enabled.

Also, in the memory system of FIG. 9, ODT of the memory device 94 is enabled or disabled depending on whether an MRS is set or not. A memory system can be fabricated such that each memory device has an identify ("ID") register instead of an MRS and the ID register is set by a memory controller to enable the ODT of the memory device.

As described above, in an ODT circuit and ODT method according to the present invention, the path of an electric current does not form between supply voltage VDD and ground voltage VSS during the enabling of ODT, thereby minimizing the consumption of an on-chip DC current.

While the present invention has been particularly shown and described with reference to preferred embodiments thereof, it will be understood by those of ordinary skill in the pertinent art that various changes in form and details may be made therein without departing from the spirit and scope of the invention as defined by the appended claims.

What is claimed is:

1. An on-die termination ("ODT") circuit for use in a synchronous memory device, the ODT circuit comprising:
    a termination voltage port for receiving a termination voltage;
    a data input/output ("I/O") port;
    a first termination resistor, one end of which is connected to the data I/O port;
    a switch that selectively connects the other end of the first termination resistor to the termination voltage port in response to a termination enable signal; and
    a termination enable signal generating circuit for generating the termination enable signal in response to a signal which indicates a valid section of input data or indicates that the present period is not a read period during write operations of the synchronous memory device, and for generating the termination enable signal in response to a signal output from a mode register set ("MRS").

2. The ODT circuit of claim 1, wherein the termination enable signal is enabled when the signal output from the MRS is disabled and when the signal which indicates a valid section of the input data or indicates that the present period is not a read period is enabled.

3. The ODT circuit of claim 1, wherein the termination enable signal is enabled when the signal output from the MRS is enabled, irrespective of the signal indicating an effective section of the input data or indicating that the present period is not a read period.

4. The ODT circuit of claim 1, further comprising a second termination resistor, one end of which is connected to the data I/O port and the other end of which is connected to the termination voltage port.

5. The ODT circuit of claim 4, wherein a resistance value of the second termination resistor is remarkably larger than that of the first termination resistor.

6. The ODT circuit of claim 1, wherein the termination voltage is generated by a voltage regulator included in a system to which the synchronous memory device is attached.

7. The ODT circuit of claim 1, wherein the termination voltage is generated by a memory controller included in a system to which the synchronous memory device is attached.

8. The ODT circuit of claim 1, wherein there is at least one termination voltage port.

9. An ODT method for a synchronous memory device, the method comprising:
    installing a termination voltage port in the synchronous memory device, the termination voltage port receiving a termination voltage;
    installing a first termination resistor in the synchronous memory device, the first termination resistor having one end connected to a data I/O port in the synchronous memory device; and
    selectively connecting the other end of the first termination resistor to the termination voltage port, wherein selectively connecting the other end of the first termination resistor is performed when an MRS included in the synchronous memory device is set outside the synchronous memory device.

10. The ODT method of claim 9, further comprising generating the termination voltage using a voltage regulator, which is included in a system to which the synchronous memory device is attached, and supplying the termination voltage to the termination voltage port.

11. The ODT method of claim 9, further comprising generating the termination voltage using a memory controller, which is included in a system to which the synchronous memory device is attached, and supplying the termination voltage to the termination voltage port.

12. An ODT method for a synchronous memory device, the method comprising:
    installing a termination voltage port in the synchronous memory device, the termination voltage port receiving a termination voltage;
    installing a first termination resistor in the synchronous memory device, the first termination resistor having one end connected to a data I/O port in the synchronous memory device;
    selectively connecting the other end of the first termination resistor to the termination voltage port; and
    installing a second termination resistor in the synchronous memory device, the second termination resistor having one end connected to the data I/O port and the other end connected to the termination voltage port.

13. The ODT method of claim 12, wherein selectively connecting the other end of the first termination resistor is performed in a valid section of input data during write operations of the synchronous memory device.

14. The ODT method of claim 12, wherein selectively connecting the other end of the first termination resistor is performed in periods other than read operations of the synchronous memory device.

15. The ODT method of claim 12, wherein a resistance value of the second termination resistor is remarkably larger than that of the first termination resistor.

16. A memory system comprising:
    a memory controller;
    a voltage regulator for generating a termination voltage; and
    a synchronous memory device that is connected to the memory controller and the voltage regulator and includes an ODT circuit,
    wherein the ODT circuit comprises:
    a termination voltage port for receiving the termination voltage from the voltage regulator;

a data I/O port for receiving input data from the memory controller or outputting output data to the memory controller;

a first termination resistor, one end of which is connected to the data I/O port; and a switch that selectively connects the other end of the first termination resistor to the termination voltage port in response to a termination enable signal, wherein the ODT circuit further comprises a termination enable signal generating circuit for generating the termination enable signal in response to a signal which indicates a valid section of input data or indicates that the present period is not a read period during write operations of the synchronous memory device, and for generating the termination enable signal in response to a signal output from an MRS.

17. The memory system of claim 16, wherein the ODT circuit further comprises a second termination resistor, one end of which is connected to the data I/O port and the other end of which is connected to the termination voltage port.

18. A memory system comprising:
a memory controller for generating a termination voltage; and
a synchronous memory device that is connected to the memory controller and includes an ODT circuit,
wherein the ODT circuit comprises:
a termination voltage port for receiving the termination voltage from the memory controller;
a data I/O port for receiving input data from the memory controller or outputs output data to the memory controller;
a first termination resistor, one end of which is connected to the data I/O port; and
a switch that selectively connects the other end of the first termination resistor to the termination voltage port in response to a termination enable signal, wherein the ODT circuit further comprises a termination enable signal generating circuit for generating the termination enable signal in response to a signal which indicates a valid section of input data or indicates that the present period is not a read period during write operations of the synchronous memory device, and for generating the termination enable signal in response to a signal output from an MRS.

19. A memory system comprising:
a memory controller for generating a termination voltage; and
a synchronous memory device that is connected to the memory controller and includes an ODT circuit,
wherein the ODT circuit comprises:
a termination voltage port for receiving the termination voltage from the memory controller;
a data I/O port for receiving input data from the memory controller or outputs output data to the memory controller;
a first termination resistor, one end of which is connected to the data I/O port; and
a switch that selectively connects the other end of the first termination resistor to the termination voltage port in response to a termination enable signal, wherein the ODT circuit further comprises a second termination resistor, one end of which is connected to the data I/O port and the other end of which is connected to the termination voltage port.

20. A memory system comprising:
a memory controller; and
a plurality of synchronous memory devices that are connected to the memory controller via a channel and include an ODT circuit,
wherein the ODT circuit is enabled in only at least one of the plurality of the memory devices that is furthest from the memory controller and is disabled in the other memory devices,
wherein the ODT circuit comprises:
a termination voltage port for receiving a termination voltage;
a data I/O port;
a first termination resistor, one end of which is connected to the data I/O port; and
a switch that connects the termination voltage port to the other end of the first termination resistor in response to an activated termination enable signal,
wherein the termination enable signal is activated when an MRS installed in the memory device is set and the ODT circuit is enabled.

* * * * *